United States Patent
Strang et al.

(10) Patent No.: US 6,913,703 B2
(45) Date of Patent: Jul. 5, 2005

(54) METHOD OF ADJUSTING THE THICKNESS OF AN ELECTRODE IN A PLASMA PROCESSING SYSTEM

(75) Inventors: Eric J. Strang, Chandler, AZ (US); Thomas F. A. Bibby, Jr., St. Albans, VT (US); Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 43 days.

(21) Appl. No.: 10/291,763

(22) Filed: Nov. 12, 2002

(65) Prior Publication Data

US 2003/0121886 A1 Jul. 3, 2003

Related U.S. Application Data

(63) Continuation of application No. PCT/US01/14636, filed on May 8, 2001.
(60) Provisional application No. 60/203,909, filed on May 12, 2000.

(51) Int. Cl.[7] ............................................. H01B 13/00
(52) U.S. Cl. ............................. 216/13; 216/38; 216/79
(58) Field of Search ............................. 216/13, 38, 41, 216/79; 134/1.1, 21

(56) References Cited

U.S. PATENT DOCUMENTS

| | | | | |
|---|---|---|---|---|
| 4,342,901 A | * | 8/1982 | Zajac ....................... | 219/121.4 |
| 4,581,118 A | * | 4/1986 | Class et al. ............ | 204/298.16 |
| 4,812,712 A | * | 3/1989 | Ohnishi et al. ............. | 315/176 |
| 5,022,979 A | * | 6/1991 | Hijikata et al. ........ | 204/298.33 |
| 5,628,869 A | * | 5/1997 | Mallon ....................... | 438/694 |
| 6,422,172 B1 | * | 7/2002 | Tanaka et al. .......... | 118/723 R |
| 6,465,051 B1 | * | 10/2002 | Sahin et al. ................ | 427/534 |
| 6,513,452 B2 | * | 2/2003 | Shan et al. .............. | 118/723 E |

FOREIGN PATENT DOCUMENTS

| | | |
|---|---|---|
| EP | 0 791 948 | 8/1997 |
| EP | 0 803 897 | 10/1997 |
| JP | 11-026435 | 1/1999 |

* cited by examiner

*Primary Examiner*—Allan Olsen
(74) *Attorney, Agent, or Firm*—Pillsbury Winthrop Shaw Pittman LLP

(57) ABSTRACT

A method of adjusting the relative thickness of an electrode assembly (10) in a plasma processing system (6) capable of supporting a plasma (20, 120) in a reactor chamber (16). The electrode assembly is arranged in the reactor chamber and includes at least one electrode having a lower surface that may have defined by at least one sacrificial protective plate (100). The electrode has a nonuniform thickness resulting from a plasma processing operation performed in the reactor chamber. The method includes a step of forming a plasma (120) designed to selectively etch the at least one electrode at the lower surface, followed by a step of etching the electrode with the aid of the plasma to reduce the nonuniformity in thickness ($T(X,Z)$) of the at least one electrode. The thickness of the electrode may be measured in situ using an acoustic transducer (210) during the processing of workpieces as well as during the restorative plasma etching of the electrode.

19 Claims, 7 Drawing Sheets

METHOD OF ADJUSTING THE THICKNESS OF AN ELECTRODE IN A PLASMA PROCESSING SYSTEM

This is a continuation of International Application No. PCT/US01/14636, which was filed on May 8, 2001, and also claims benefit of U.S. Application No. 60/203,909, which was filed on May 12, 2000, the contents of both of which are incorporated herein in their entirety.

FIELD OF THE INVENTION

The present invention pertains to electrodes used in plasma processing systems, and in particular, pertains to electrodes having a sacrificial protective layer.

BACKGROUND OF THE INVENTION

Plasma processing systems are used in semiconductor manufacturing to remove material from or to deposit material on a workpiece (e.g., semiconductor substrate) in the process of making integrated circuit (IC) devices. A key factor in obtaining the highest yield and overall quality of ICs is the uniformity of the plasma etching and deposition processes.

A problem that has plagued prior art plasma processing systems is the control of the plasma to obtain uniform etching and deposition. In plasma processing systems, one factor affecting the degree of etch or deposition uniformity is the spatial uniformity of the plasma density above the workpiece. The latter is dictated by the design of the overall system, and in particular the design of the electrodes (or plasma source) used to create the plasma.

One approach to improving etching and deposition uniformity has been to use a segmented electrode comprising a plurality of metallic electrode segments separated by an insulator. Each electrode segment is electrically connected to an RF power supply that provides power to each electrode segment. Control of the frequency, amplitude and phase of the RF power delivered to each electrode segment can control the plasma density profile of the plasma, and hence etch and deposition characteristics of the system.

Certain types of segmented electrodes have plates of silicon affixed to the side of the electrode segments that face the plasma. These silicon plates are generally many times the thickness of a typical silicon wafer, e.g., about 5–10 mm or so. The silicon plates are used to prevent erosion of the metallic electrode segments to which they are affixed. In the absence of the silicon plates, the high-energy ions in the plasma can etch the electrode and deposit electrode material onto the workpiece, which can affect the performance of devices made from the workpiece. In other words, the electrode can be an unintended sputtering target with the workpiece being deposited with electrode material. The use of protective silicon plates eliminates contamination caused by (high energy) etching the electrode when the workpiece is also made of silicon.

Another advantage of using protective silicon plates on the electrode segments is the etched silicon can act as a source of scavenging specie in the plasma. For example, in some oxide etch applications involving fluorocarbon chemistry, introducing silicon to the plasma above the substrate can lead to the scavenging of fluorine radical. This, in turn, leads to improved etch selectivity between silicon dioxide and silicon. This effect is particularly desirable when etching a silicon dioxide film formed on the workpiece.

The objective of using segmented electrodes in plasma processing is to allow the spatial distribution of the plasma density to be adjusted locally across the workpiece to achieve spatial uniformity of plasma etch and deposition. As mentioned above, each electrode segment is driven by an RF power source whose frequency, amplitude, and phase are controlled separately. Since the field beneath each electrode can change, the amount of material eroded from each silicon plate can differ between electrode segments. For example, upon processing of about 5000 to 10000 wafers (corresponding to about 300 hours RF time), this differential erosion can lead to thickness variations of several millimeters between adjacent silicon plates. Due to the narrow spacing (i.e. ~20 mm) between the electrode and the wafer, common for high aspect ratio, narrow gap capacitively coupled plasma (CCP), a thickness variation of only a few millimeters corresponds to approximately 5 to 10% of the electrode-workpiece spacing. This variation can dramatically affect process conditions. For example, local workpiece etch rates can change by as much as 500 to 1000 Angstroms/minute.

In a reactor for performing a deposition operation of the chemical vapor deposition (CVD) type, an electrode may be provided at the top of the plasma region to capacitively couple RF power into the plasma. A certain amount of the deposition material generated in the plasma may be deposited on the electrode in a manner that will give the electrode a varying thickness, particularly if the electrode is a segmented electrode and the supply of RF power to each segment is individually controlled. The resulting electrode thickness variation can adversely affect the distribution of RF power within the plasma and hence the spatial uniformity of the plasma.

BRIEF SUMMARY OF THE INVENTION

The present invention pertains to electrodes used in plasma processing systems, and in particular, pertains to electrodes which may experience a nonuniform change in thickness during plasma processing operations. Such electrodes may have a sacrificial protective layer, or plate.

A first aspect of the invention is a process of adjusting the relative thickness of an electrode assembly in a plasma processing system capable of supporting plasma in a reactor chamber. The electrode assembly is arranged in the reactor chamber and has a thickness which was initially uniform but which has become nonuniform due to erosion of a sacrificial protective layer made of a first material by a first plasma designed to etch a film of a second material on a first workpiece, which workpiece may be made of the first material, or due to the fact that the electrode is being used as a sputtering target for a deposition operation, or due to formation of a layer of material thereon during a deposition operation such as CVD. The method comprises the steps of forming a second plasma designed to selectively etch the electrode surface or protective layer, and then etching the electrode surface or protective layer with said second plasma to reduce the variation in thickness.

The process may include first removing the first workpiece from the reactor chamber and replacing the first workpiece with a sacrificial workpiece, In the present invention, the electrode assembly may comprise a segmented electrode or a single main electrode, or a combination of such electrodes.

A second aspect of the invention is the method as described above, further including the step, prior to the first step, of running experiments to obtain empirical data pertaining to the erosion rate and spatial distribution of erosion of the at least one protective plate, and the etch rate and spatial etch distribution of the etching of the at least one protective plate. This information is preferably stored in a control system that controls the plasma processing of the workpieces and also the plasma etching of the protective plates.

A third aspect of the invention is the method as described above, further including measuring the thickness of the protective plates in situ using an acoustic transducer that emits acoustic signals through the plates. The return signals provide information about the thickness of the plates. This information is forwarded to a control system, which assesses when plasma processing of workpieces should be interrupted to recondition the electrode plates. In addition, the acoustic measurements can be used to measure the thickness of the plates during plate etch to assess when the plates have a thickness differential that is within acceptable limits.

DETAILED DESCRIPTION OF THE INVENTION

The present invention pertains to electrodes used in plasma processing systems, and will be described in detail with reference to electrodes having a sacrificial protective layer and used in a reactor to perform an etching operation on a workpiece.

Figure 1:
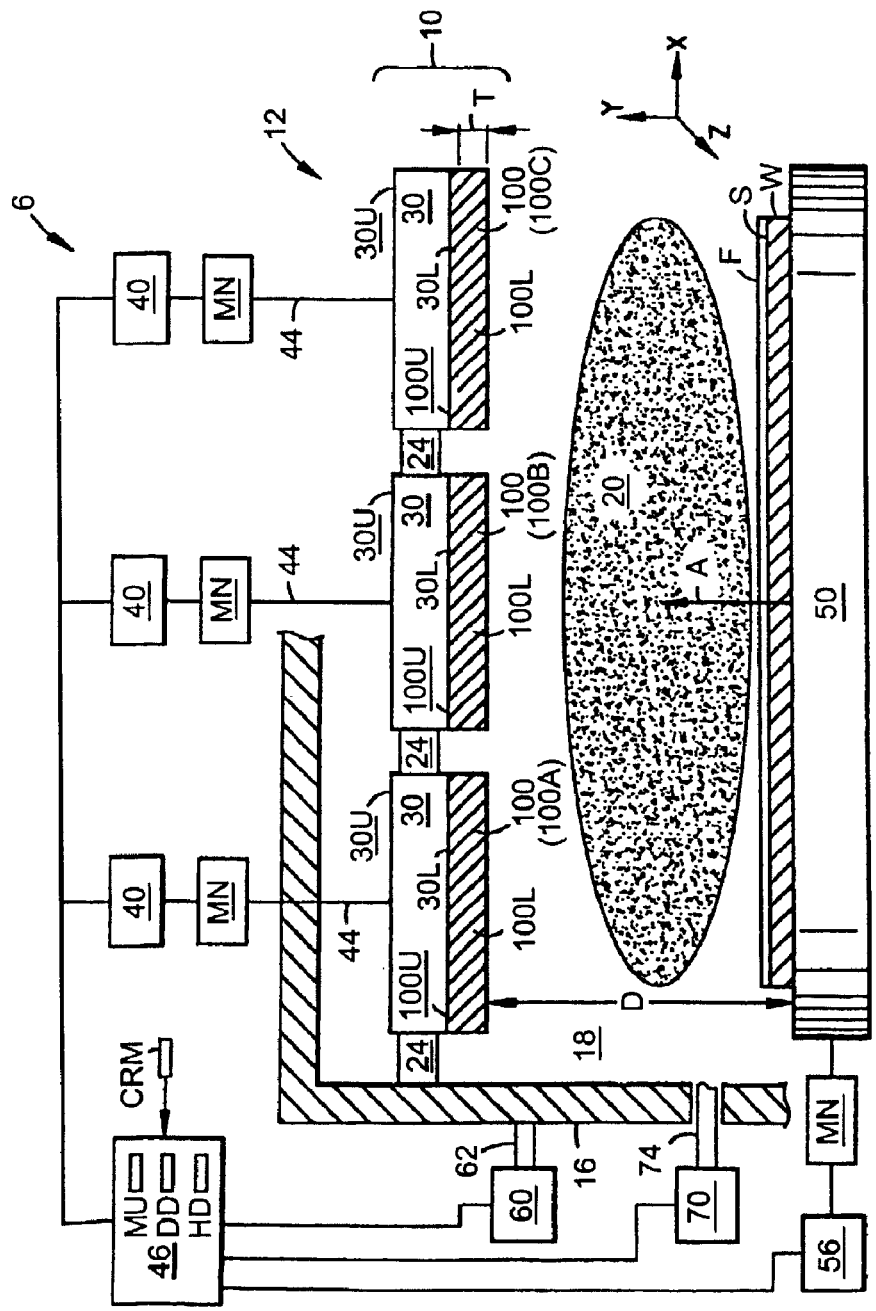
FIG. 1 is a schematic cross-sectional diagram of a plasma processing system for carrying out the method of the present invention, showing an electrode assembly comprising a segmented electrode and protective plates on the electrode segments prior to processing workpieces.

With reference to FIG. 1, there is shown a plasma processing system 6 having an electrode assembly 10 arranged within a plasma reactor chamber 16. The latter has an interior region 18 capable of supporting plasma 20 having a plasma density profile. Electrode assembly 10 may be any one of a number of known electrode assemblies, such as a segmented electrode, a single electrode, or a multi-part electrode assembly composed of a large unitary electrode and a segmented electrode disposed above the unitary electrode and capacitively coupled thereto. An example of a segmented electrode is disclosed in U.S. Provisional Patent Application No. 60/185,069, entitled "MULTI-ZONE RF ELECTRODE FOR FIELD/PLASMA UNIFORMITY CONTROL IN CAPACITIVE PLASMA SOURCES," filed Feb. 25, 2000. An example of a multi-part electrode assembly is disclosed in U.S. Provisional Patent Application No. 60/175,284, entitled "SEGMENTED ELECTRODE APPARATUS AND METHOD FOR PLASMA PROCESSING", filed Jan. 10, 2000. Both of these patent applications are incorporated by reference herein. As discussed further below, the present invention is applicable to electrode assemblies other than segmented electrodes. However, for ease of illustration, the present invention is described with respect to an electrode assembly comprising a segmented electrode.

Accordingly, electrode assembly 10 comprises, in one embodiment of the present invention, a segmented electrode 12 having a plurality of substantially planar metallic electrode segments 30 each having an upper surface 30U and a lower surface 30L. The latter surface is closest to plasma 20. Electrode segments 30 may be made of one of a number of metals, such as aluminum. Electrode segments 30 are separated by an insulator 24 to prevent electrical communication (e.g., an electrical discharge) between the segments. Insulator 24 may be a rigid structure made of a dielectric material, such as quartz or ceramic. Each electrode segment 30 is electrically connected to an RF power supply 40 via a transmission line 44 connected to upper surface 30U. RF power supplies 40 are in turn connected to a main control system 46 that controls the frequency, amplitude and phase of the RF power delivered to electrode segments 30. For example, as disclosed in Provisional U.S. Patent Application No. 60/192,508, METHOD AND APPARATUS FOR CONTROLLING POWER DELIVERED TO A MULTIPLE SEGMENT ELECTRODE, filed on Mar. 28, 2000, a master oscillator generates a signal tied to an independent phase shifter and amplifier for each segment. Independent oscillators may be employed for different frequencies.

In a preferred embodiment, main control system 46 is a computer having a memory unit MU with both random-access memory (RAM) and read-only memory (ROM), a central processing unit CPU (e.g., PENTIUM™ processor from Intel Corporation), and a hard disk HD, all electronically connected. Hard disk HD serves as a secondary computer-readable storage medium, and may be, for example, a hard disk drive for storing information corresponding to instructions for control system 46 to carry out the present invention, as described below. Control system 46 also preferably includes a disk drive DD, electronically connected to hard disk HD, memory unit MU and central processing unit CPU, wherein the disk drive is capable of accepting and reading (and even writing to) a computer-readable medium CRM, such as a floppy disk or compact disk (CD), on which is stored information corresponding to instructions for control system 46 to carry out the present invention. It is also preferable that main control system 46 have data acquisition and control capability. A preferred control system 46 is a computer, such as a DELL PRECISION WORKSTATION 610™, available from Dell Corporation, Dallas, Tex. Control system 46 controls the operation of system 6 in the plasma processing of workpiece W and the plasma etching of plates 100, as described below.

A match network MN is preferably provided in each power line 44 between each RF power supply 40 and its corresponding electrode segment 30 to assist in impedance matching.

System 6 also includes a workpiece support member (e.g., a chuck) 50 for supporting a workpiece W. Workpiece W is, for example, a silicon wafer that has been patterned in the process of fabricating a semiconductor device. Workpiece W includes an upper surface S having a film F and/or patterned topography comprising various geometries such as trenches, contacts, etc. (not shown) formed thereon. The materials forming the different film layers across workpiece surface S and in various topography used in semiconductor processing include silicon, silicon dioxide (SiO2), silicon nitride (SiN), aluminum, copper, titanium nitride (TiN), etc.

Electrically connected to workpiece support member 50 and control system 46 is a workpiece support RF power supply 56 for biasing workpiece support member 50. Similarly, as with RF power supply 40, a match network MN is inserted in the transmission line between RF power supply 56 and chuck 50 to maximize power transfer. Thus, the latter serves as a lower electrode to which segmented electrode 12 is capacitively coupled.

System 6 further includes a gas supply system 60 in pneumatic communication with interior region 18 of chamber 20 via a gas supply line 62, for supplying gas to the chamber interior region to purge the chamber, to create the plasma and to provide appropriate chemistries for the given process. The particular gases included in gas supply system 60 depend on the application. However, for plasma etching applications, gas supply system 60 includes such gases as chlorine, hydrogen-bromide, octafluorocyclobutane, and various other fluorocarbon compounds, as well as inerts such as argon and helium, etc., and for chemical vapor deposition applications, includes silane, ammonia, tungsten-tetrachloride, titanium-tetrachloride, and the like. Gas supply system 60 is electrically connected to control system 46, which controls the operation of the gas supply system.

Also included in system 6 is a vacuum system 70 electrically connected to control system 46 and pneumatically connected to interior region 18 of chamber 16 via a vacuum line 74. Vacuum system is used to pump down chamber 16 and to maintain the pressure at a level of about 1 to 100 mT for most processes, though the precise pressure depends on the particular process.

Electrode Protective Plates

Electrode assembly 10 further includes a plurality of protective plates 100 each having a lower surface 100L and an upper surface 100U attached to lower surface 30L of a respective electrode segment 30. Each protective plate 100 is made of a material that is compatible with or the same as the workpiece to be processed, e.g., silicon, germanium, or gallium arsenide, to name a few. Plates 100 preferably have a thickness T several times greater than the thickness of a workpiece W constituted by a standard silicon wafer, i.e., 5 mm<T<15 mm. In FIG. 1, three plates 100A, 100B and 100C are identified having different locations along the X-direction relative to a central axis A passing perpendicularly through workpiece W in the Y-direction.

Plasma Processing of Workpiece W

Figure 2:
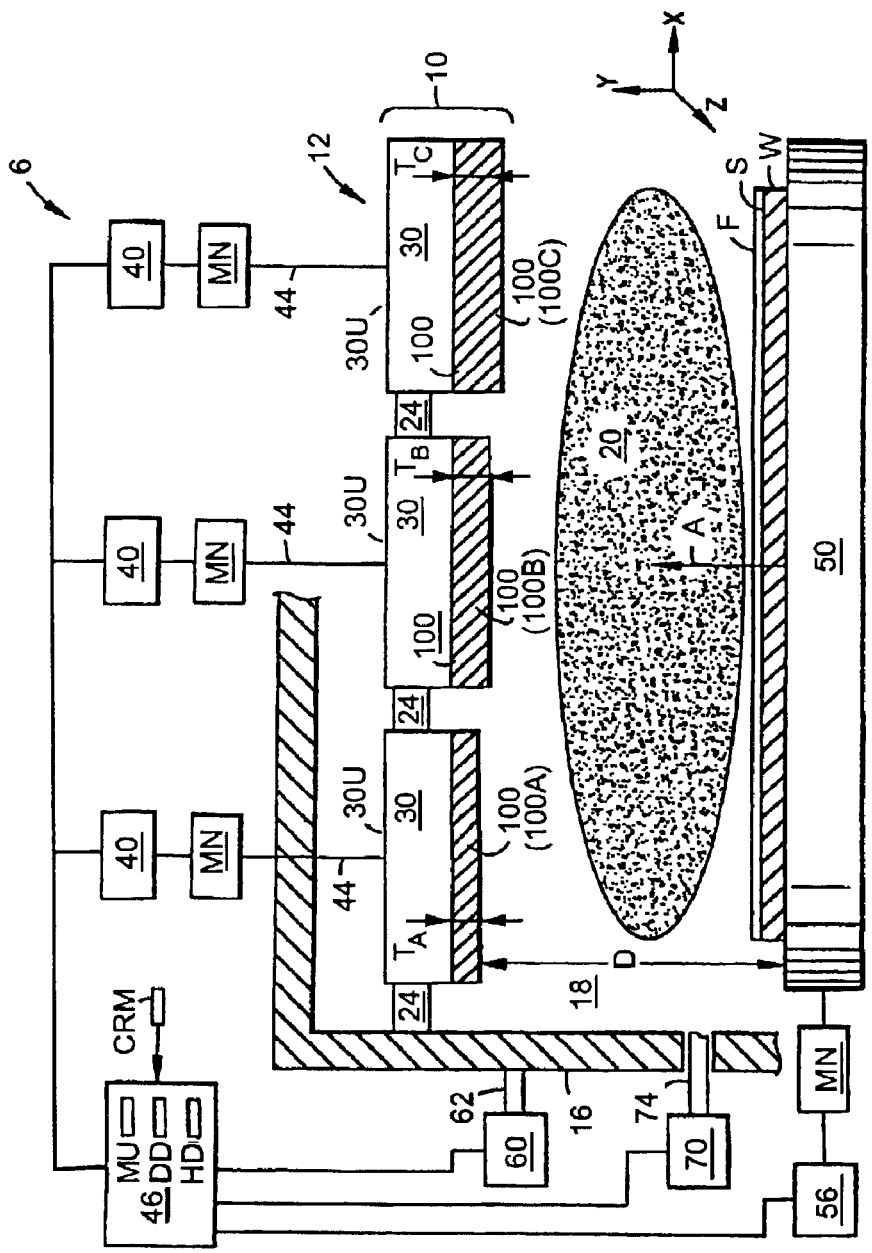
FIG. 2 shows the system of FIG. 1, but after having processed a number of workpieces so that the protective plates on the electrode segments have different thicknesses due to differential erosion of the plates from the plasma when processing the workpieces.

With reference now to FIG. 2, the plasma processing of film F on workpiece W is carried out using plasma 20, which is designed to selectively etch film F. For etching an oxide layer or feature, plasma 20 is composed, most often, a fluorocarbon gas such as $CF_4$ or $C_4F_8$ and, in general, it is desirable to have a high concentration of $CF_2$ radical, as compared to F, CF, and other species. When workpiece W is a semiconductor substrate made of gallium-arsenide or germanium (rather than silicon), the chemistries are often similar to those for processing silicon. In particular, for a gallium-arsenide substrate, silicon dioxide ($SiO_2$) is generally used as an oxide and silicon nitride (SiN) is generally used as a nitride. In fact, semiconductor substrate etching is generally limited to trench etching for capacitors in DRAM and contact vias for 3D VLSI stacking.

However, when etching a specific feature on workpiece W, plasma 20 also erodes material from lower surface 100L of plates 100 as well as other consumable surfaces in the process chamber, albeit at a much slower rate than the etching of film F. Unfortunately, the erosion rate of plates 100 is typically not spatially uniform in the X- and Z-directions. This is because different RF power levels are typically supplied to the different electrode segments to adjust the etch process. For example, center electrode segment 100B may be provided with less RF power than surrounding electrode segments 100A and 100C. Accordingly, center plate 100B may not be eroded as much as edge plates 100A or 100C. Therefore, the thickness T for each electrode segment 100 (i.e., $T_A$, $T_B$, $T_C$) changes by different amounts over time, leaving a thickness differential $\Delta T$ (e.g., $T_A - T_B$, $T_A - T_C$, and $T_B - T_C$) between the plates.

While the thickness differential $\Delta T$ may not be significant after processing a single workpiece W, this differential can become several millimeters after many hundreds of workpieces, which as mentioned above, is a substantial fraction of the separation distance D between segmented electrode 12 and workpiece W. As the capacitance between electrode segments 20 and workpiece W is a function of separation distance D, a change in D causes a change in the electric field between the electrode segments and the workpiece, which in turn changes the plasma density profile of plasma 20. This change in the plasma density profile causes an undesirable change in the processing (e.g., etching rate and etch uniformity of film F) when processing workpiece W.

Plate Thickness Adjustment Process

Figure 3:
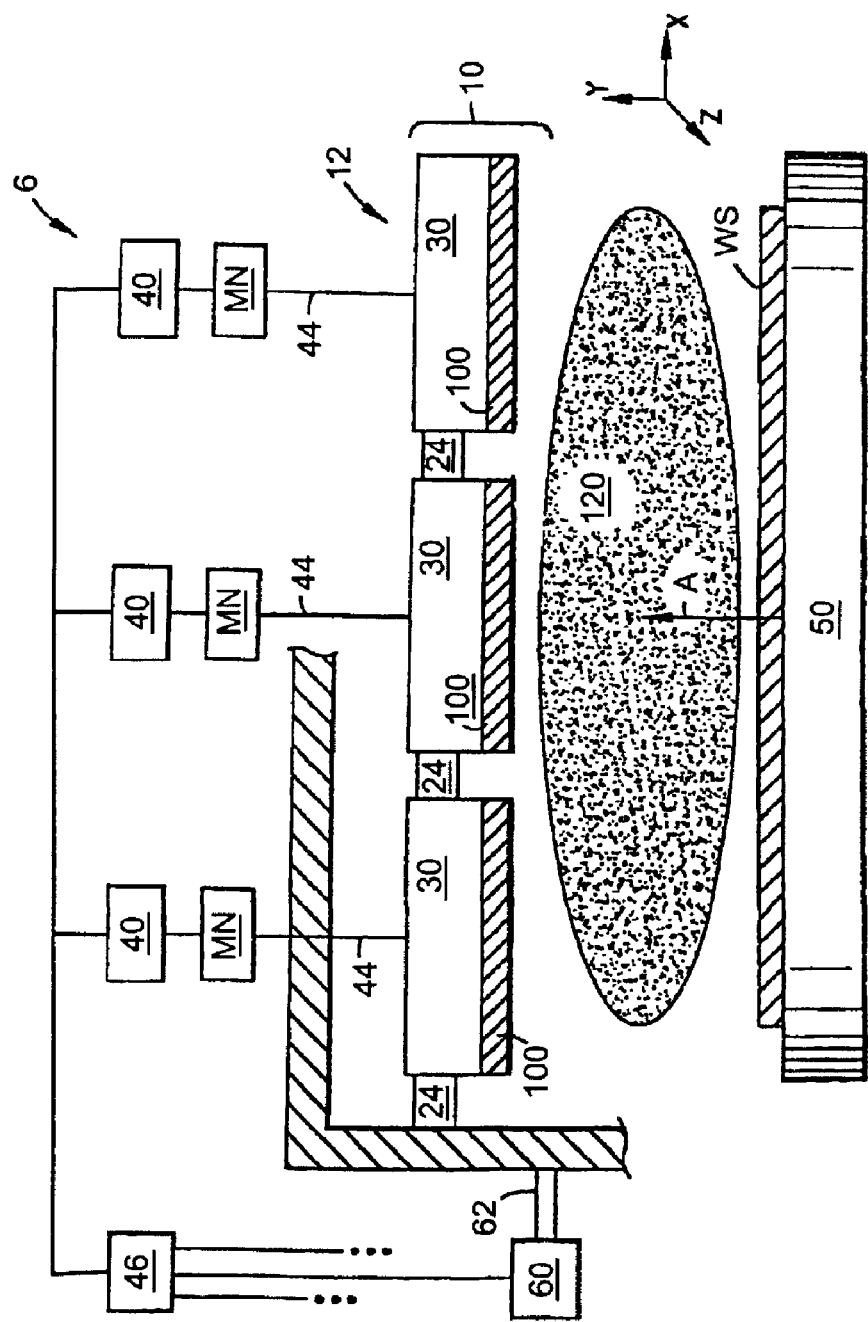
FIG. 3 shows the system of FIG. 1, but now with a sacrificial workpiece and a newly formed plasma designed to selectively etch the protective plates so as to reduce the thickness differential between the plates.

With reference now to FIG. 3, the process of adjusting the thickness of plates 100 is now described. This involves etching plates 100 with a second plasma designed to selectively etch the material of the plates to reduce the thickness differential between them. The process of etching plates 100 to accomplish this is referred to herein as "plate etch."

FIG. 3 shows system 6 of FIG. 2, except that a sacrificial workpiece WS is now placed on workpiece support member 50 in place of workpiece W to be processed. Sacrificial workpiece WS is preferably made of the same material as plates 100 (or a compatible material such as quartz for silicon processing) and is for the purpose of protecting workpiece support member 50 from being etched. Thus, for a silicon semiconductor process where plates 100 are made of silicon, sacrificial workpiece WS is also preferably made of silicon, as would be workpiece W to be processed as a patterned device workpiece having film F.

Once sacrificial workpiece WS is placed on workpiece support member 50, control system 46 sends an electrical signal to vacuum system 70, which pumps down chamber 16 to the appropriate pressure. A purge gas, such as nitrogen, may also be supplied from gas supply system 60 to purge chamber 16.

Next, control system 46 sends an electrical signal to gas supply system 60 and an etchant gas is introduced into the chamber that is suitable for etching plates 100. Suitable gases for etching silicon plates 100 include $CF_4$, $SF_6$, $Cl_2$, and HBr. It is preferable to use a gas or mixture of gases from those currently available for the specific process to avoid the additional cost of additional gas plumbing, gas(es), etc. For example, if the primary process is an oxide etch using $CF_4$ or $C_4F_8$ (e.g., an often-used oxide etch process recipe calls for $C_4F_8$, Ar, $O_2$), then it would be preferred to use a subset of these "available" gases to etch silicon plates 100. However, one would alter the process recipe, i.e. pressure, gas mixture, RF power, etc., to increase the silicon etch rate (the process may call for the increase of fluorine radical present in the cleaning/planarizing plasma). One example of a specific process recipe is as follows: $SF_6$ gas is introduced into the chamber at a flow rate of 500 sccm while applying suction to maintain a chamber pressure of 250 mTorr, while 2 to 3 kW of RF power is supplied to form the plasma.

Once the appropriate etch gas(es) is/are introduced into interior region 18, control system 46 activates RF power supplies 40 to provide RF power to segmented electrode segments 30 to energize the gas to form a new plasma 120 designed to selectively etch plates 100 so as to reduce the thickness differential between the plates, resulting in the state shown in FIG. 3 Generally speaking, plasma 120 is designed to etch the material making up plates 100. In the case where this material is silicon or germanium, plasma 120 has a high concentration of fluorine (relative to other radicals present in the plasma).

Figure 4:
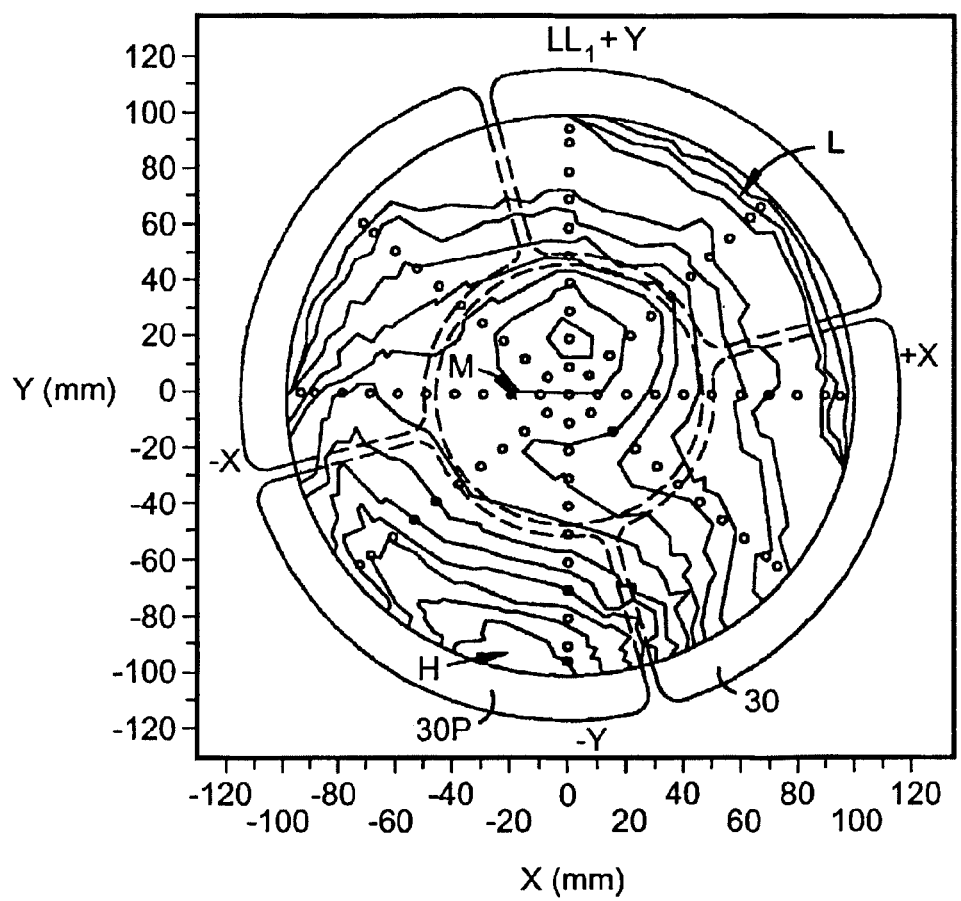
FIG. 4 is a plan view of a workpiece and the electrode segments arranged thereover, illustrating etch rate distribution as contours when a single electrode segment is powered, with region H representing an area of high etch rate, and region L representing an area of low etch rate, and M representing a region of medium etch rate.

After plasma 120 is formed, plates 100 are preferentially etched in proportion to their thickness so as to reduce the differences in plate thickness T between the plates. This is achieved by suitably adjusting the RF power amplitude, frequency, waveform and/or phase to cause a differential etch rate of plates 100. For example, if center plate 100B needs to be etched more than etch plates 100A and 100C, then the RF power provided to the center plate is greater than that provided to the edge plates. In fact, control system 46 may turn on RF power only to the electrode segment where etching is to be performed. The inventors have observed that powering a single electrode segment 30 can result in plasma 20 whose density is locally peaked under the respective electrode segment. This is illustrated in FIG. 4, which shows the etch rate distribution when a single electrode segment is powered. In this case, a peripheral electrode segment 30P is powered and workpiece etch rate is highest under segment 30P, as indicated by the contours in region H In fact, it may be beneficial to to sequence the RF power to individual electrode segments for "planarizing" each electrode segment 30. The sequencing of RF power may be over-lapped in order to sustain plasma 20 (i.e. so as not to extinguish the plasma while turning off power to one segment and turning on power to the next segment).

The plate etch process can be carried out until all plates 100 have substantially the same thickness T i.e., until plates 100 are planarized. Alternatively, the process can be carried out until the differences in thickness T between plates 100 are within acceptable limits (e.g., a predetermined threshold value). Once the differences in thickness T between plates 100 are within acceptable limits, the spacing between the workpiece surface WS and the bottom surface of electrode plates 100L may be evaluated. It can then be adjusted to the nominally specified value (for a pre-determined optimal process) by adjusting the chuck (or workpiece) elevation.

Empirical Model for Determining Plate Thickness and Etching

A key aspect of the present invention is determining how long to perform the plate etch so that the proper adjustment in relative plate thickness is achieved. One method of performing the above-described plate etch is based on empirical data. Obtaining such data involves running a first set of experiments involving etching workpieces for various processes and recording the process parameters while assessing how fast plates 100 erode with time, and the spatial distribution of the plate erosion. A second set of experiments is then run with sacrificial workpieces for the various processes to determine the etch rate and spatial distribution of the plate etch process. The second set of experiments would involve different combinations of electrode segment power levels. The second set of experiments would be required to optimize the electrode plate re-planarization etch step. The optimal process recipe would take into account the effects of total electrode RF power, sub-electrode distribution of power, gas flow rate, gas specie (s), pressure, etc. Data from the first and second set of experiments is then stored in memory unit MU of control system 46 as a database or look-up table. The data can be used to determine the settings of the various processing parameters (e.g., chamber pressure, RF power, RF frequency, RF amplitude, gas mixture, etc.) and how long the plate etch should be performed. The plate etch may be performed until the thickness differential $\Delta T$ is reduced to a predetermined value.

Acoustic Plate Thickness Measurement Technique

An alternative technique for measuring how long to perform the plate etch includes measuring the thickness of plates 100 using an acoustic signal.

Figure 5:
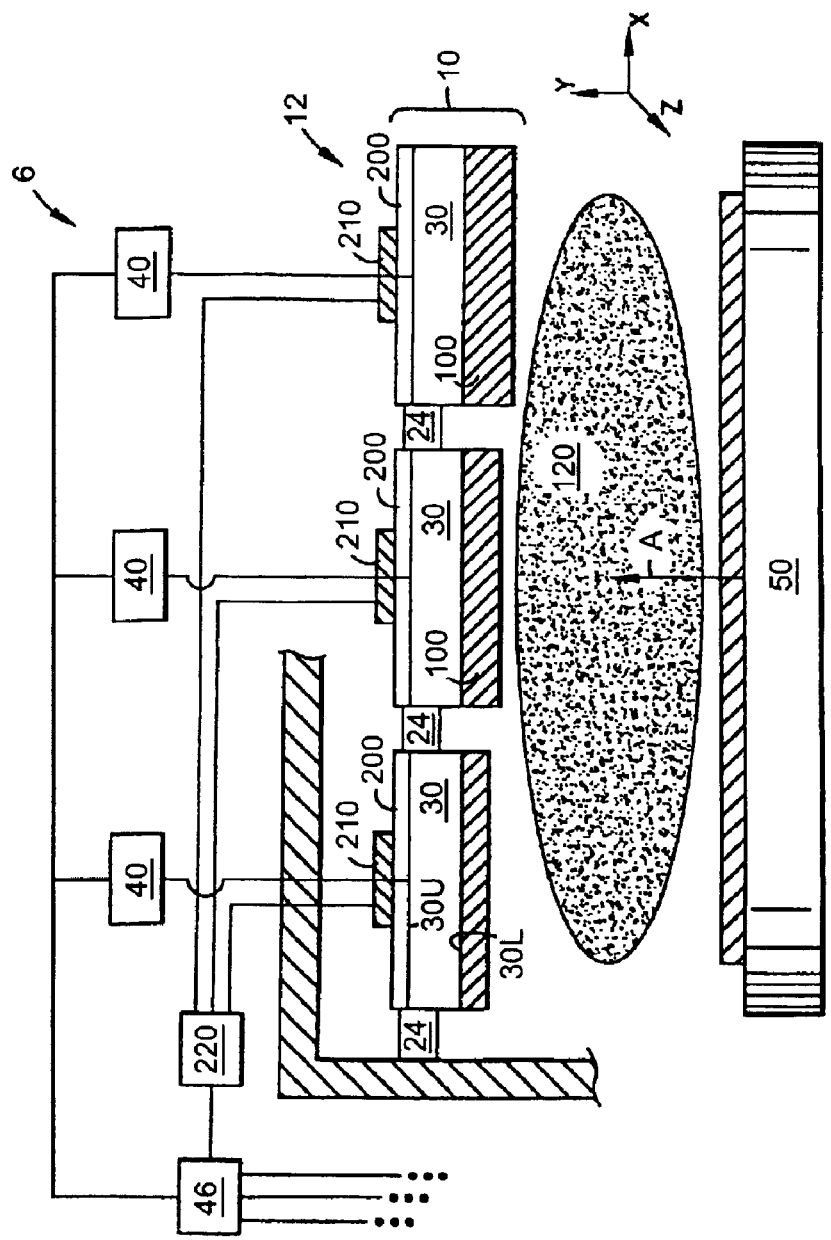
FIG. 5 shows the electrode assembly of FIG. 2, but with an acoustic transducer and acoustic transducer control unit for measuring the thickness of the protective plates in situ and in real-time so that the plate erosion and plate etching processes can be monitored.

With reference to FIG. 5, in the present embodiment of the invention, each electrode segment 30 includes an insulating layer 200 atop upper surface 30U, and an acoustic transducer 210 atop the insulating layer. Acoustic transducer 210 is preferably piezo-electric, and insulating layer 200 may be an oxide or sapphire. Each acoustic transducer 210 is electrically connected to a transducer control unit 220 that drives the transducers. Transducer control unit 220 in turn is electrically connected to control system 46, which controls the activation and operation of the transducer control unit, and process signals received by transducer 210, as discussed below.

Figure 6:
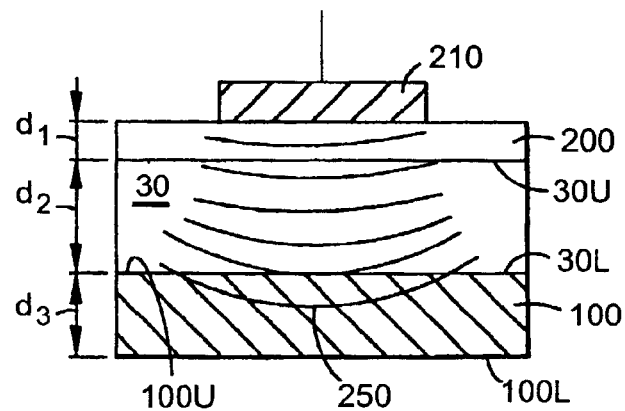
FIG. 6 is a cross-sectional diagram of an electrode segment with a protective plate, an oxide layer, and an acoustic transducer showing the thicknesses of each and the propagation of acoustic energy (sound waves) through each.
Figure 7:
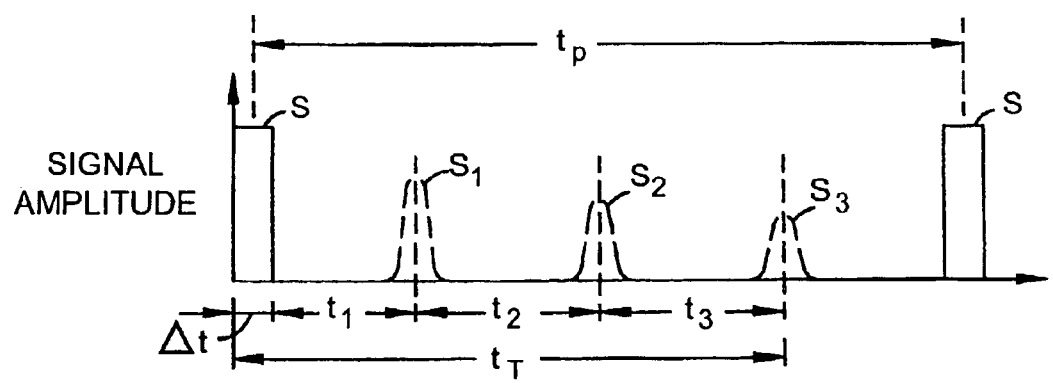
FIG. 7 is a plot of the signal amplitude vs. time for signals emitted and received by the acoustic transducer.

With reference now to FIGS. 6 and 7, acoustic transducer 210 emits signals S of acoustic energy 250 through insulator 200, electrode 30 and plate 100. Signal S travels through insulator 200, electrode 30 and plate 100 at velocities of $V_{200}$, $V_{30}$ and $V_{100}$, respectively. Signal S reflects from upper surface 30U of electrode 30 and upper surface 100U and lower surface 100L of plate 100. This results in return signals $S_1$, $S_2$ and $S_3$ received by acoustic transducer 210. The travel times associated with signals $S_1$, $S_2$ and $S_3$ are $t_1$, $t_2$ and $t_3$, which are given by:

$$t_1 = 2d_1/V_{200} \quad t_2 = 2d_2/V_{30} \quad t_3 = 2d_3/V_{100}$$

The total travel time for signal S is thus $t_T = t_1 + t_2 + t_3$

The frequency $f_S$ of signals S emitted by transducer 210 is thus preferably greater than $1/t_T$, which provides enough time for each signal to make a complete round trip from transducer 210 to lower surface 100L of plate 100 and back before the next signal is emitted. The period between signals is $1/f_S = t_S$. Also, the pulse width of signal S is $\Delta t_S$, which can be, for example, about 5% of $t_P$.

Based on the above, the thickness T of plate 100 corresponds to $d_3$, which can be deduced from analyzing signals $S_1-S_3$ and determining $d_3$ from the relationships set forth above. The calculation for determining thickness T of plate 100 is preferably carried out in control system 46.

Accordingly, by measuring the plate 100 thickness in situ during plasma processing of workpieces W, the point in time when electrode plates need to be reconditioned can be readily assessed. Further, by measuring the thickness during plate etching, the point in time where the plate thickness differential is within acceptable limits can be readily assessed.

Returning to FIG. 1, once the plate etch process is carried out for a sufficient duration, control system 100 sends an electronic signal to RF power supplies 40 (during plate planarization, no power to workpiece support member 150 is required) to stop delivering RF power to electrode segments 30 and workpiece support member 50. Control system 46 then sends an electronic signal to gas supply system 60 to flow a purge gas into interior region 18 of chamber 16 to purge the chamber of the etchant gas.

Once chamber 16 is purged, sacrificial substrate WS is removed and additional (i.e., one or more) workpieces W to be process are then plasma processed. The cycle of plasma processing a number of workpieces W and then performing a plate etch to restore the thickness distribution of plates 100 is continued as long as necessary.

Alternate Electrode Assemblies

Figure 8:
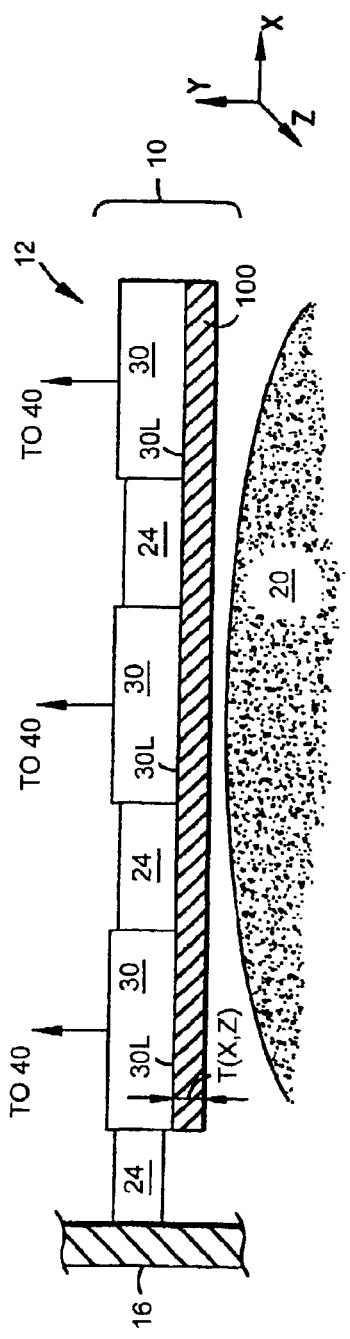
FIG. 8 is a schematic cross-sectional diagram of an alternative electrode assembly having a plurality of electrode segments and a single protective plate.

As mentioned above, the method of the present invention is explained using an electrode assembly 10 having a segmented electrode 12 for the sake of illustration. In fact, the present invention can apply to other types of electrode assemblies. For example, with reference to FIG. 8 and electrode assembly 10, a single protective plate 100 is attached to lower surface 30L of electrode segments 30, rather than using individual plates 100 sized to each electrode segment. Generally, the method of the present invention applies to one or more plates 100, wherein the variation in thickness T in the one or more plates varies as a function of X and Z i.e., T(X,Z), due to erosion from plasma 20. In this case, the thickness differential $\Delta T$ can be measured as the largest difference in thickness, e.g., $$\Delta T = |T_{MAX} - T_{MIN}|.$$

Figure 9:
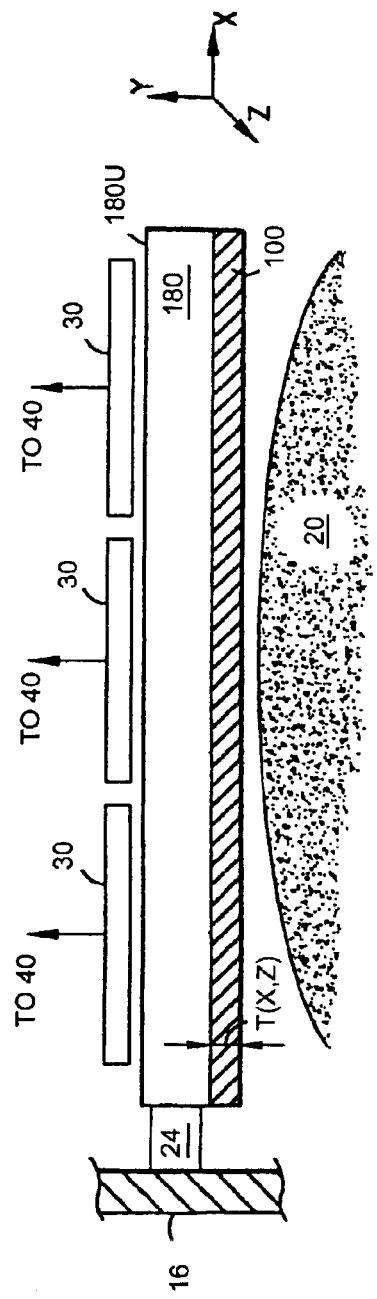
FIG. 9 is a schematic cross-sectional diagram of another alternative electrode assembly having an upper electrode with a lower surface adjacent the plasma to which is attached a single protective plate, and an upper surface opposite the lower surface adjacent which are arranged a plurality of electrode segments capacitively coupled to the upper electrode.

With reference to FIG. 9, another possible electrode assembly 10 includes a large upper electrode 180 having an upper surface 180U opposite plasma 20 and electrode segments 30 that are adjacent, and capacitively coupled, to upper electrode 180, as described in the above-cited Provisional U.S. Patent Application No. 60/175,284. It will be apparent to one skilled in the art that the method of the present invention is applicable to these electrode assemblies as well as other like assemblies, in the manner described above in connection with segmented electrode 12, or in a manner very similar thereto since different RF power levels can be applied to different parts of plate 100.

The invention may also be employed to eliminate thickness variations which occur during deposition operations due to the fact that the electrode is being used as a sputtering target or due to formation of a layer of material thereon during a deposition operation such as CVD. In the former case, the electrode will be made of the material to be deposited, while in the latter case the material to be deposited is derived from a gas which is dissociated and ionized in a plasma and the primary purpose of the electrode is to capacitively couple RF power into the plasma.

In fact, the many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Moreover, the method and apparatus of the present invention, like related apparatus and methods used in the semiconductor arts that are complex in nature, are often best practiced by empirically determining the appropriate values of the operating parameters, or by conducting computer simulations to arrive at best design for a given application. Accordingly, all suitable modifications and equivalents should be considered as falling within the spirit and scope of the invention.

What is claimed is:

1. A method of adjusting the relative thickness of an electrode assembly in a plasma processing system capable of supporting a plasma in a reactor chamber, the electrode assembly being arranged in the reactor and including at least one electrode having a nonuniform thickness as a result of a plasma processing operation performed on workpieces, the method comprising:

a) forming a plasma designed to selectively etch the at least one electrode; and b) etching the at least one electrode with a plasma to restore a uniform thickness to the at least one electrode.

2. A method according to claim 1, wherein said electrode assembly comprises at least one sacrificial protective plate of a first material having a lower surface exposed to each plasma, the plasma processing operation is an etching operation which subjects the at least one sacrificial protective plate to erosion, and each workpiece is composed of a film of a second material which is etched by the etching operation.

3. A method according to claim 2, wherein said etching the at least one electrode includes introducing at least one etch gas into the reactor chamber.

4. A method according to claim 3, wherein said at least one etch gas is selected from the group of gases consisting of: HBr, $Cl_2$, $SF_6$, $CF_4$, $C_4F_8$, $C_5F_8$, Ar, and $O_2$.

5. A method according to claim 2, wherein prior to said forming of the plasma, removing a first workpiece from the reactor chamber and replacing the first workpiece with a sacrificial workpiece.

6. A process according to claim 5, wherein said sacrificial workpiece is made of the first material.

7. A method according to claim 2, wherein the at least one electrode comprises a plurality of electrode segments.

8. A method according to claim 2, wherein the at least one electrode has an upper surface opposite the lower surface and the electrode assembly further includes a plurality of electrode segments arranged adjacent the upper surface of the at least one electrode.

9. A method according to claim 2 wherein the first material is silicon.

10. A method according to claim 2, wherein prior to said forming of the plasma, performing experiments to obtain empirical data pertaining to erosion rate and spatial distribution of the erosion of the at least one protective plate, and etch rate and spatial etch distribution of the etching of the at least one protective plate.

11. A method according to claim 10, wherein
   prior to said forming of the plasma and after said performing of experiments, storing said empirical data in a database; and
   performing said etching of the at least one electrode for an amount of time based on said empirical data stored in said database.

12. A method according to claim 2, wherein said etching of the at least one electrode is performed until the variation in thickness of the at least one protective plate is reduced to a predetermined value.

13. A method according to claim 12, wherein said thickness variation is reduced to the point where the at least one protective plate has a substantially constant thickness.

14. A method according to claim 2, wherein said etching of the at least one electrode includes measuring the thickness of the at least one protective plate.

15. A method according to claim 14, further including providing measurements of plate thickness to a control system for controlling the operation of the etch in said etching of the at least one electrode.

16. A method according to claim 14, wherein said measuring of the thickness of the at least one protective plate is performed using acoustic signals.

17. A method according to claim 16, further including providing measurements of film thickness to a control system for controlling the operation of the etch in said etching of the at least one electrode.

18. A method according to claim 2, wherein the at least one electrode is comprises a plurality of electrode segments and said etching of the at least one electrode includes sequencing RF power to successive electrode segments.

19. A method according to claim 2, wherein the at least one electrode comprises a plurality of electrode segments and the at least one sacrificial protective plate comprises a plurality of protective plates each attached to the lower surface of a respective electrode segment.

* * * * *